United States Patent
Qin et al.

(10) Patent No.: US 11,156,882 B2
(45) Date of Patent: Oct. 26, 2021

(54) CIRCUIT SUBSTRATE, DISPLAY DEVICE AND DRIVING METHOD

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Peng Qin, Beijing (CN); Cheng Zuo, Beijing (CN); Kangpeng Dang, Beijing (CN); Yang Rao, Beijing (CN); Bo Wang, Beijing (CN); Zhong Jin, Beijing (CN); Lihua Jiang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 158 days.

(21) Appl. No.: 16/394,417

(22) Filed: Apr. 25, 2019

(65) Prior Publication Data

US 2019/0331954 A1    Oct. 31, 2019

(30) Foreign Application Priority Data

Apr. 27, 2018 (CN) .......................... 201810393488.7

(51) Int. Cl.
G09G 3/36    (2006.01)
G02F 1/1345  (2006.01)
(Continued)

(52) U.S. Cl.
CPC .... *G02F 1/13454* (2013.01); *G02F 1/136286* (2013.01); *G06F 1/1643* (2013.01);
(Continued)

(58) Field of Classification Search
CPC .............. G02F 1/13454; G02F 1/1362; G02F 1/136286; G02F 1/13338; H01L 27/323;
(Continued)

(56) References Cited

U.S. PATENT DOCUMENTS 7,403,184 B1 *   7/2008  Moon .................. G09G 3/3688
                                                          345/87
2007/0195215 A1 * 8/2007  Murade ................ G02F 1/1345
                                                          349/42
(Continued)

FOREIGN PATENT DOCUMENTS

CN    101404146 A    4/2009
CN    102270413 A    12/2011
(Continued)

OTHER PUBLICATIONS

The First Chinese Office Action dated Aug. 3, 2020; Appln. No. 201810393488.7.

*Primary Examiner* — Lunyi Lao
*Assistant Examiner* — Jarurat Suteerawongsa

(57) ABSTRACT

A circuit substrate, a display device and a driving method are provided. The circuit substrate includes a base substrate, a gate driving circuit, and at least one signal trace group which are on the base substrate. The signal trace group includes two signal traces, and the two signal traces are electrically connected with the gate driving circuit and are configured to provide clock signals with inverted phases to the gate driving circuit; the two signal traces are respectively in different layers and are insulated from each other; and
(Continued)

orthographic projections of the two signal traces on the base substrate at least partially overlap with each other.

12 Claims, 8 Drawing Sheets

(51) Int. Cl.
*G02F 1/1362* (2006.01)
*G06F 3/041* (2006.01)
*G06F 3/044* (2006.01)
*G09G 3/3225* (2016.01)
*H01L 27/32* (2006.01)
*G06F 1/16* (2006.01)

(52) U.S. Cl.
CPC ............ *G06F 3/044* (2013.01); *G06F 3/0412* (2013.01); *G09G 3/3225* (2013.01); *G09G 3/3648* (2013.01); *H01L 27/323* (2013.01); *H01L 27/3276* (2013.01); *G09G 2310/0286* (2013.01)

(58) Field of Classification Search
CPC . H01L 27/3276; G06F 3/0418; G06F 1/1643; G06F 3/0412; G06F 3/044; G09G 3/36; G09G 3/3225; G09G 3/3648; G09G 2310/0286; G09G 3/3674; G09G 2300/0408

See application file for complete search history.

(56) References Cited

U.S. PATENT DOCUMENTS

| | | | |
|---|---|---|---|
| 2009/0091523 A1 | 4/2009 | Fujita et al. | |
| 2010/0177085 A1 | 7/2010 | Yamagishi et al. | |
| 2014/0078077 A1* | 3/2014 | Choi | G06F 3/0446 345/173 |
| 2015/0187247 A1* | 7/2015 | Lee | G09G 3/20 345/205 |
| 2016/0125954 A1* | 5/2016 | Gu | G09G 3/3688 377/64 |
| 2017/0053617 A1* | 2/2017 | Hong | H05K 1/147 |
| 2017/0098413 A1* | 4/2017 | Lee | G11C 19/28 |
| 2018/0315387 A1* | 11/2018 | Park | G09G 3/3266 |
| 2019/0172884 A1* | 6/2019 | Shim | H01L 27/3265 |

FOREIGN PATENT DOCUMENTS

| | | |
|---|---|---|
| CN | 105761662 A | 7/2016 |
| WO | 2016/170700 A1 | 11/2015 |

\* cited by examiner

CIRCUIT SUBSTRATE, DISPLAY DEVICE AND DRIVING METHOD

The application claims priority to the Chinese patent application No. 201810393488.7, filed on Apr. 27, 2018, the entire disclosure of which is incorporated herein by reference as part of the present application.

TECHNICAL FIELD

At least one embodiment of the present disclosure relates to a circuit substrate, a display device and a driving method.

BACKGROUND

With the development of touch technology, more and more electronic products interact with human by a touch mode. For an electronic product with a touch function, noise on a signal trace providing a clock signal for a gate driving circuit is an important factor affecting touch performance, thus how to reduce the noise on the signal trace becomes an important problem to be solved.

SUMMARY

At least one embodiment of the present disclosure provides a circuit substrate. The circuit substrate comprises a base substrate, a gate driving circuit, and at least one signal trace group which are on the base substrate. The signal trace group comprises two signal traces, and the two signal traces are electrically connected with the gate driving circuit and are configured to provide clock signals with inverted phases to the gate driving circuit; the two signal traces are respectively in different layers and are insulated from each other; and orthographic projections of the two signal traces on the base substrate at least partially overlap with each other.

For example, in a circuit substrate provided by an embodiment of the present disclosure, the orthographic projections of the two signal traces on the base substrate completely overlap with each other.

For example, a circuit substrate provided by an embodiment of the present disclosure further comprises a gate insulation layer for a thin film transistor and a passivation layer covering the thin film transistor, the two signal traces are spaced apart from each other by the gate insulation layer so that the two signal traces are insulated from each other; or the two signal traces are spaced apart from each other by the passivation layer so that the two signal traces are insulated from each other.

For example, a circuit substrate provided by an embodiment of the present disclosure further comprises a gate metal layer on the base substrate and a source/drain metal layer on the base substrate; the gate insulation layer is between the gate metal layer and the source/drain metal layer; one of the two signal traces of the signal trace group is in a same layer as one of the gate metal layer and the source/drain metal layer, and the other of the two signal traces of the signal trace group is in a same layer as the other of the gate metal layer and the source/drain metal layer.

For example, in a circuit substrate provided by an embodiment of the present disclosure, the gate insulation layer and the passivation layer are between the two signal traces.

For example, in a circuit substrate provided by an embodiment of the present disclosure, at least one signal trace group comprises a plurality of signal trace groups, and each of the plurality of signal trace groups comprises two signal traces; the two signal traces of each of the plurality of signal trace groups are respectively in different layers and are insulated from each other; and orthographic projections of the two signal traces of each of the plurality of signal trace groups on the base substrate at least partially overlap with each other.

For example, a circuit substrate provided by an embodiment of the present disclosure further comprises a gate insulation layer for a thin film transistor and a passivation layer covering the thin film transistor; the plurality of signal trace groups comprise a first signal trace group and a second signal trace group; two signal traces of the first signal trace group are spaced apart from each other by the gate insulation layer so that the two signal traces of the first signal trace group are insulated from each other, and two signal traces of the second signal trace group are spaced apart from each other by the gate insulation layer so that the two signal traces of the second signal trace group are insulated from each other; or the two signal traces of the first signal trace group are spaced apart from each other by the passivation layer so that the two signal traces of the first signal trace group are insulated from each other, and the two signal traces of the second signal trace group are spaced apart from each other by the passivation layer so that the two signal traces of the second signal trace group are insulated from each other.

For example, a circuit substrate provided by an embodiment of the present disclosure further comprises a gate insulation layer for a thin film transistor and a passivation layer covering the thin film transistor; the plurality of signal trace groups comprise a first signal trace group and a second signal trace group; two signal traces of the first signal trace group are spaced apart from each other by the gate insulation layer so that the two signal traces of the first signal trace group are insulated from each other, and two signal traces of the second signal trace group are spaced apart from each other by the passivation layer so that the two signal traces of the second signal trace group are insulated from each other.

For example, in a circuit substrate provided by an embodiment of the present disclosure, the gate insulation layer and the passivation layer are between the two signal traces of the second signal trace group.

For example, in a circuit substrate provided by an embodiment of the present disclosure, one signal trace of the first signal trace group and one signal trace of the second signal trace group are in a same layer.

For example, in a circuit substrate provided by an embodiment of the present disclosure, the two signal traces of the signal trace group are respectively a first signal trace and a second signal trace; the gate driving circuit comprises a plurality of cascaded shift register units, the first signal trace is electrically connected with a (2n−1)th-stage of the shift register units, and the second signal trace is electrically connected with a (2n)th-stage of the shift register units, in which n is an integer greater than or equal to 1.

For example, in a circuit substrate provided by an embodiment of the present disclosure, the two signal traces of the first signal trace group are respectively a first signal trace and a second signal trace, and the two signal traces of the second signal trace group are respectively a third signal trace and a fourth signal trace; the gate driving circuit comprises a plurality of cascaded shift register units, the first signal trace is electrically connected with a (4m−3)th-stage of the shift register units, the third signal trace is electrically connected with a (4m−2)th-stage of the shift register units, the second signal trace is electrically connected with a (4m−1)th-stage of the shift register units, and the fourth signal trace is electrically connected with a (4m)th-stage of the shift register units, in which m is an integer greater than or equal to 1.

For example, a circuit substrate provided by an embodiment of the present disclosure further comprises a plurality of touch electrodes, and the plurality of touch electrodes are on the base substrate and arranged in an array comprises a touch electrode.

At least one embodiment of the present disclosure further provides a display device, the display device comprises a circuit substrate, the circuit substrate comprises a base substrate, a gate driving circuit on the base substrate, and at least one signal trace group on the base substrate, and the signal trace group comprises two signal traces, and the two signal traces are electrically connected with the gate driving circuit and are configured to provide clock signals with inverted phases to the gate driving circuit; the two signal traces are respectively in different layers and are insulated from each other; and orthographic projections of the two signal traces on the base substrate at least partially overlap with each other.

For example, in a display device provided by an embodiment of the present disclosure, the circuit substrate comprises a plurality of touch electrodes, and the plurality of touch electrodes are on the base substrate and arranged in an array.

At least one embodiment of the present disclosure further provides a driving method for the circuit substrate, and the driving method comprises: providing clock signals to the gate driving circuit through the two signal traces; and providing the clock signals with inverted phases to the gate driving circuit respectively through the two signal traces of the signal trace group.

For example, in a driving method provided by an embodiment of the present disclosure, the two signal traces of the signal trace group are respectively a first signal trace and a second signal trace, and the gate driving circuit comprises a plurality of cascaded shift register units; and the driving method further comprises: providing a clock signal to a (2n−1)th-stage of the shift register units through the first signal trace, and providing another clock signal to a (2n)th-stage of the shift register units through the second signal trace, in which n is an integer greater than or equal to 1.

For example, in a driving method provided by one embodiment of the present disclosure, the at least one signal trace group comprises a first signal trace group and a second signal trace group; two signal traces of the first signal trace group are respectively a first signal trace and a second signal trace, two signal traces of the second signal trace group are respectively a third signal trace and a fourth signal trace, and the gate driving circuit comprises a plurality of cascaded shift register units; the driving method further comprises: providing a clock signal to a (4m−3)th-stage of the shift register units through the first signal trace, providing another clock signal to a (4m−2)th-stage of the shift register units through the third signal trace, providing further another clock signal to a (4m−1)th-stage of the shift register units through the second signal trace, and providing further another clock signal to a (4m)th-stage of the shift register units through the fourth signal trace, in which m is an integer greater than or equal to 1.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
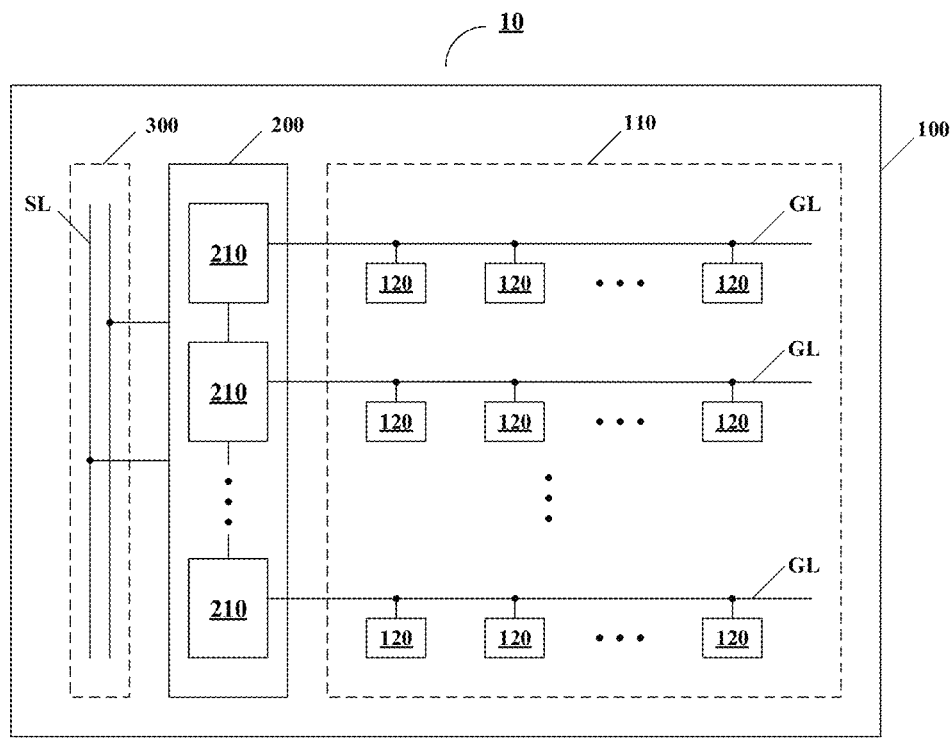
FIG. 1A is a schematic diagram of a circuit substrate provided by an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a display panel technology, in order to realize low cost and narrow bezel, a GOA (Gate driver On Array) technology can be adopted, that is, a gate driving circuit is integrated into the display panel by a thin film transistor manufacturing process, thereby achieving advantages such as narrow bezel, reducing assembly cost and the like.

For an electronic product with a touch function, noise on signal traces providing clock signals for a gate driving circuit is an important factor affecting touch performance. For example, a difference between a high level and a low level of clock signals provided to the gate driving circuit may be more than 30V (for example, 25V for the high level and −8V for the low level), and noises caused by jumps between the high level and the low level of clock signals at a high frequency affect the touch performance of the electronic product, especially, a poor touch performance may occur in an edge region of a display panel, such as line jitter, abnormal ghost points, etc.

At least one embodiment of the present disclosure provides a circuit substrate. The circuit substrate includes a base substrate, a gate driving circuit and at least one signal trace group which are on the base substrate. The signal trace group includes two signal traces, and the two signal traces are electrically connected with the gate driving circuit and are configured to provide clock signals with inverted phases to the gate driving circuit; the two signal traces are respectively in different layers and are insulated from each other; and orthographic projections of the two signal traces on the base substrate at least partially overlap with each other. At least one embodiment of the present disclosure further provides a display device and a driving method corresponding to the above-mentioned circuit substrate.

The circuit substrate, the display device and the driving method provided by the embodiments of the present disclosure can reduce the noises of clock signals on the signal traces and reduce an interference of the clock signals on a touch product adopting the circuit substrate, thus the touch performance of the touch product is improved.

Embodiments and examples of the present disclosure are described in detail below in combination with the figures.

At least one embodiment of the present disclosure provides a circuit substrate 10, as illustrated in FIG. 1A, and the circuit substrate 10 includes a base substrate 100, a gate driving circuit 200 and at least one signal trace group 300 which are on the base substrate 100. It should be noted that only one signal trace group 300 is shown in FIG. 1A schematically, the embodiments of the present disclosure include this case but is not limited to this case, and for example, in another embodiment of the present disclosure, the circuit substrate includes two or three or more than three signal trace groups 300.

For example, the circuit substrate 10 is in a display panel, the gate driving circuit 200 includes a plurality of cascaded shift register units 210, and a plurality of output terminals of the gate driving circuit 200 are connected with a plurality of gate lines GL in a display region 110 one-by-one, and the output terminals of the gate driving circuit 200 are used to provide gate scanning signals for pixel units 120 in the display region 110.

For example, the signal trace group 300 includes two signal traces SL, and the two signal traces SL are electrically connected with the gate driving circuit 200 and are configured to provide clock signals with inverted phases to the gate driving circuit 200. The two signal traces SL are respectively in different layers and are insulated from each other; and orthographic projections of the two signal traces SL on the base substrate 100 at least partially overlap with each other.

Figure 1B:
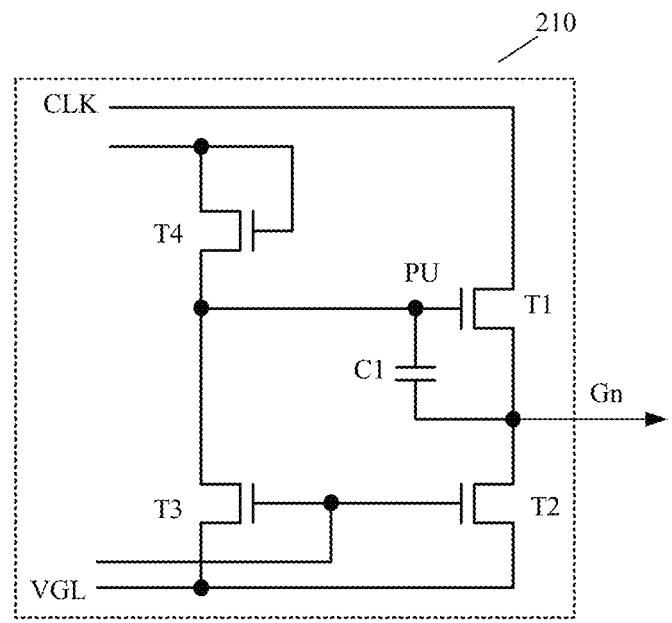
FIG. 1B is schematic circuit structure diagram of an exemplary shift register unit.

FIG. 1B is schematic circuit structure diagram of an exemplary shift register unit 210, and for example, the shift register unit 210 is a (n)th-stage of the shift register units of the gate driving circuit 200. As illustrated in FIG. 1B, the shift register unit 210 includes a first transistor T1, a second transistor T2, a third transistor T3, a fourth transistor T4 and a storage capacitor C1.

The first transistor T1 of the shift register unit 210 is an output transistor of the shift register unit 210. For example, a first electrode of the first transistor TI is connected with a clock signal CLK, a second electrode of the first transistor TI is connected with a first electrode of the second transistor T2 to obtain an output terminal of the shift register unit 210, and the output terminal of the shift register unit 210 outputs a gate scanning signal Gn used for a (n)th row of pixel units (for example, the signal Gn is a square-wave pulse signal, and a pulse part of the square-wave pulse signal is a turn-on level and a non-pulse part is a turn-off level) and an input signal used for a next stage of the shift register unit 210. A gate electrode of the first transistor T1 is connected with a pull-up node PU, thus the gate electrode of the first transistor T1 is connected with a first electrode of the third transistor T3 and a second electrode of the fourth transistor T4.

A second electrode of the second transistor T2 is connected with a second electrode of the third transistor T3 and receives a low-level signal VGL. A gate electrode of the second transistor T2 is connected with a gate electrode of the third transistor T3 and an output terminal of a shift register unit 210 in a next row which is (n+1)th row to receive a gate scanning signal G(n+1) which is used as an output pull-down control signal. The first electrode of the second transistor T2 is connected with the second electrode of the first transistor T1, thus the second transistor T2 is turned on under control of the output pull-down control signal, and an output signal of the output terminal is pulled down to the low-level signal VGL without outputting the gate scanning signal Gn.

The first electrode of the third transistor T3 is also connected with the pull-up node PU, thus the first electrode of the third transistor T3 is connected with the second electrode of the fourth transistor T4 and the gate electrode of the first transistor T1. The second electrode of the third transistor T3 receives the low-level signal VGL. Also, the gate electrode of the third transistor T3 is connected with the output terminal of the shift register unit 210 in a next row which is the (n+1)th row to receive the gate scanning signal G(n+1) which is used as an reset control signal (the reset control signal is also used as the output pull-down control signal), thus the third transistor T3 can be turned on under control of the reset control signal, and the pull-up node PU is reset to the low-level signal VGL to turn off the first transistor T1.

A first electrode of the fourth transistor T4 is connected with its own gate electrode, and the first electrode of the fourth transistor T4 is connected with an output terminal of a shift register unit 210 in a previous row which is (n−1)th row to receive a gate scanning signal G(n−1) which is used as an input signal (the input signal is also used as an input control signal), and the second electrode of the fourth transistor T4 is connected with the pull-up node PU, thus when the fourth transistor T4 is turned on, the pull-up node PU is charged so that a level of the pull-up node PU turns on the first transistor T1, thus the clock signal CLK is output through the output terminal. One terminal of the storage capacitor C1 is connected with the gate electrode of the first transistor T1, i.e. the pull-up node PU, and another terminal of the storage capacitor C1 is connected with the second electrode of the first transistor T1, so that the level of the pull-up node PU can be stored, and the storage capacitor C1 can continue to pull up the level of the pull-up node PU through its bootstrap effect when the first transistor T1 is turned on to improve an output performance.

When the gate driving circuit 200 composed of the plurality of cascaded shift register units 210 as illustrated in FIG. 1B is operated, in a case where the gate scanning signal G(n−1) is at a high level, the fourth transistor T4 is turned on and charges the pull-up node PU. A rising level of the pull-up node PU turns on the first transistor T1, thus the clock signal CLK is output at the output terminal through the first transistor T1, that is, the gate scanning signal Gn is equivalent to the clock signal CLK. When the clock signal CLK is at a high level, the gate scanning signal Gn is also at a high level. When the gate scanning signal Gn is at a high level, the shift register units 210 of the gate driving circuit 200 inputs the high-level signal Gn into a corresponding gate line GL, so that gate electrodes of thin film transistors in all the pixel units corresponding to the gate line GL are applied to the high-level signal Gn, thus the thin film transistors are turned on. A data signal passes through the thin film transistor in each pixel unit and is input to a liquid crystal capacitor in each pixel unit, thus the liquid crystal capacitor in each pixel unit is charged, thus a signal voltage of each pixel unit is written and maintained. When the gate scanning signal G(n+1) is at a high level, the second transistor T2 and the third transistor T3 are turned on to reset the pull-up node PU and pull down the output terminal. Therefore, for example, a progressive scanning driving function is realized by the gate driving circuit 200.

Because a source electrode and a drain electrode of each of the transistors mentioned above are symmetrical, the source electrode and the drain electrode of each of the transistors can be exchanged. For example, the first electrode is the source electrode or the drain electrode, and the second electrode is the drain electrode or the source electrode. In the present disclosure, the source electrode and the drain electrode of each of the thin film transistors are collectively referred to as "source/drain electrode". For example, the transistors mentioned above are N-type transistors. Of course, the transistors mentioned above are not limited to N-type transistors, but at least partially are P-type transistors, for example. Therefore, polarities of corresponding turn-on signal and the output scanning signal can be changed accordingly.

It should be noted that in the embodiments of the present disclosure, the structure of each of the cascaded shift register units 210 of the gate driving circuit 200 is not limited to the case described above. Each of the cascaded shift register units 210 of the gate driving circuit 200 can possess any applicable structure, or can include more or less transistors and/or capacitors, for example, each of the cascaded shift register units 210 includes a sub-circuit for realizing functions such as controlling the pull-up node, controlling the pull-down node, noise reduction, etc., no limitation is imposed to this in the embodiments of the present disclosure.

Figure 2:
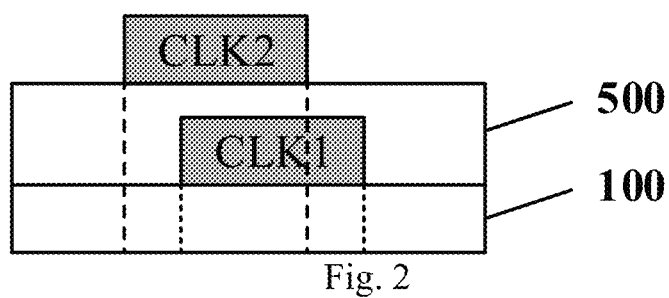
FIG. 2 is a schematic diagram of a case where orthographic projections of two signal traces of a signal trace group on a base substrate partially overlap with each other.

For example, as illustrated in FIG. 2, the two signal traces SL of the signal trace group 300 are respectively a first signal trace CLK1 and a second signal trace CLK2. The first signal trace CLK1 and the second signal trace CK2 are respectively in different layers on the base substrate 100 and are insulated from each other. For example, an insulation layer 500 is between the first signal trace CLK1 and the second signal trace CLK2, and the insulation layer 500 is a layer structure with an insulation characteristic such as a gate insulation layer, a passivation layer or an interlayer insulation layer (the interlayer insulation layer represents an insulation layer between other layers on the circuit substrate 10) etc., and the insulation layer 500 is described in detail in the following, no repetition herein.

For example, in the example illustrated in FIG. 2, orthographic projections of the first signal trace CLK1 and the second signal trace CLK2 on the base substrate 100 partially overlap with each other.

In the circuit substrate 10 provided by at least one embodiment of the present disclosure, each of the at least one signal trace group 300 includes two signal traces SL, the two signal traces SL are respectively in different layers, and orthographic projections of the two signal traces SL on the base substrate 100 partially overlap with each other. Because the clock signals transmitted by the two signal traces SL are inverted phase to each other, interferences caused by noises of the clock signals on the two signal traces SL are partially offset by each other, and the interference of the clock signals on a touch product adopting the circuit substrate can be reduced, so that the touch performance of the touch product is improved. In addition, because the orthographic projections of the two signal traces SL on the base substrate 100 partially overlap with each other, a parasitic capacitance between the two signal traces SL is reduced.

It should be noted that in the embodiments of the present disclosure, the inverted phase of the two clock signals means that the two clock signals have a same frequency, a same high level and a same low level, and when one of the two clock signals is at the high level and the other one is at the low level. It is same in the following embodiments and is not be repeated.

Figure 3:
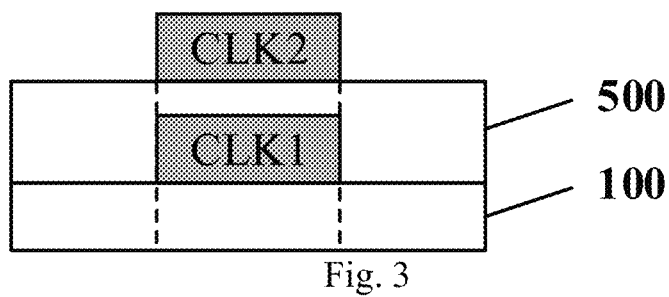
FIG. 3 is a schematic diagram of a case where orthographic projections of two signal traces of a signal trace group on a base substrate completely overlap with each other.

For example, in another example, as illustrated in FIG. 3, the orthographic projections of the first signal trace CLK1 and the second signal trace CLK2 on the base substrate 100 completely overlap with each other. In this way, interferences caused by noises of the clock signals on the two signal traces SL are further offset by each other, which further reduces interferences caused by the clock signals on the touch product adopting the circuit substrate, so that the touch performance of the touch product is further improved.

Figure 4:
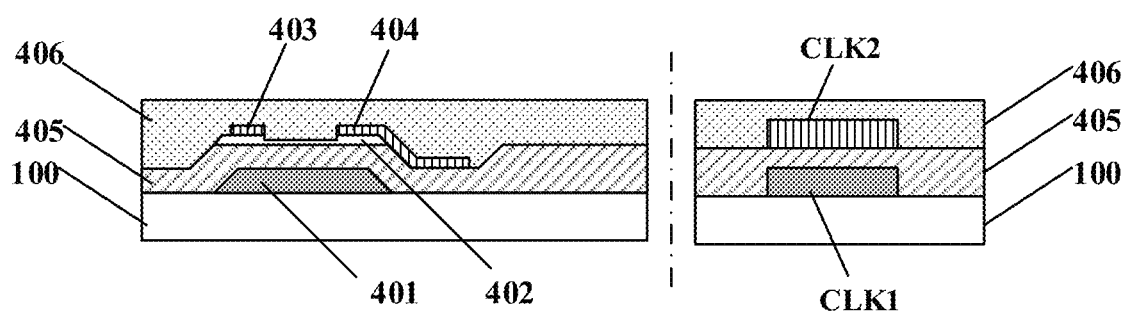
FIG. 4 is a schematic diagram of an arrangement mode of two signal traces of one signal trace group.
Figure 5:
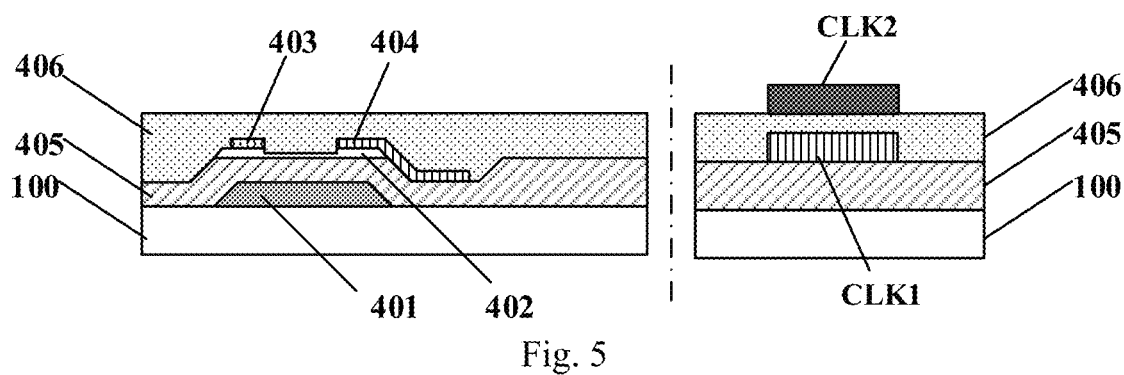
FIG. 5 is another schematic diagram of an arrangement mode of two signal traces of one signal trace group.

In the circuit substrate 10 provided by the embodiments of the present disclosure, as illustrated in FIG. 4 and FIG. 5, the circuit substrate 10 further includes a thin film transistor on the base substrate 100 and a passivation layer 406 covering the thin film transistor. For example, the thin film transistor includes a gate electrode (gate metal layer) 401, a gate insulation layer 405, an active layer 402 and source/drain electrode (source/drain metal layer) 403, 404 which are on the substrate 100. For example, the thin film transistor is a thin film transistor constituting the gate driving circuit 200 or a thin film transistor constituting the pixel unit 120.

It should be noted that in the figures of the present disclosure, 401 represents both the gate and the metal layer where the gate is located, 403 and 404 represent both the source/drain electrode and the source/drain metal layer where the source/drain electrode is located. It is same in the following embodiments and is not be repeated.

For example, in an example, as illustrated in FIG. 4, the gate insulation layer 405 is between the gate metal layer 401 and the source/drain metal layer 403, 404. One of the two signal traces (the first signal trace CLK1 and the second signal trace CLK2) of the signal trace group 300 is in a same layer as one of the gate metal layer 401 and the source/drain metal layer 403, 404, and the other of the two signal traces of the signal trace group 300 is in a same layer as the other of the gate metal layer 401 and the source/drain metal layer 403, 404. That is, the two signal traces (the first signal trace CLK1 and the second signal trace CLK2) of the signal trace group 300 are spaced apart from each other by the gate insulation layer 405 so that the two signal traces are insulated from each other. For example, in the example illustrated in FIG. 4, the first signal trace CLK1 and the gate metal layer 401 are in a same layer, and the second signal trace CLK2 and the source/drain metal layer 403, 404 are in a same layer. The embodiments of the present disclosure include this case but are not limited to this case, for example, the first signal trace CLK1 and the source/drain metal layer 403, 404 are in a same layer, and the second signal trace CLK2 and the gate metal layer 401 are in a same layer. For example, as illustrated in FIG. 4, a passivation layer 406 covering both the second signal trace CLK2 and the thin film transistor is provided to protect the second signal trace CLK2 and the thin film transistor.

For example, in another example, as illustrated in FIG. 5, the two signal traces (the first signal trace CLK1 and the second signal trace CLK2) of the signal trace group 300 are spaced apart from each other by the passivation layer 406 so that the two signal traces are insulated from each other. For example, the first signal trace CLK1 and the source/drain metal layer 403, 404 are in a same layer, and the second signal trace CLK2 is on the passivation layer 406, so that the first signal trace CLK1 and the second signal trace CLK2 are spaced apart from each other by the passivation layer 406 so that the two signal traces are insulated from each other. Of course, the positions of the first signal trace CLK1 and the second signal trace CLK2 can be interchanged, no limitation is imposed to this in the present disclosure.

Figure 6:
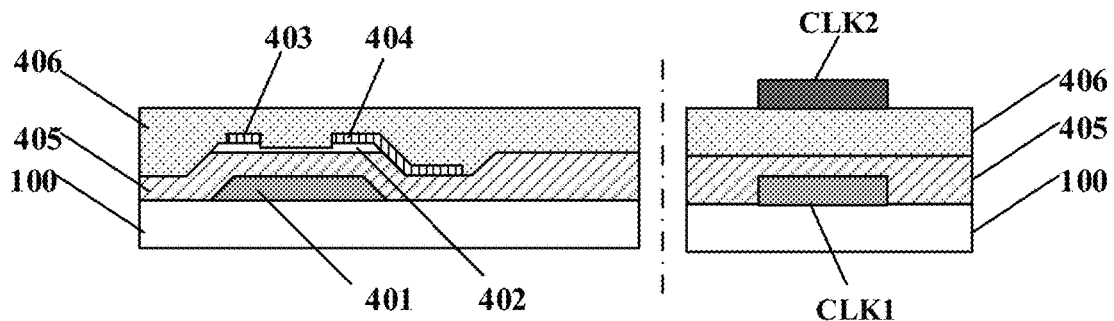
FIG. 6 is another schematic diagram of an arrangement mode of two signal traces of one signal trace group.

For example, in further another example, as illustrated in FIG. 6, the gate insulation layer 405 and the passivation layer 406 are between the two signal traces (the first signal trace CLK1 and the second signal trace CLK2). For example, the first signal trace CLK1 and the gate metal layer 401 are in a same layer, and the second signal trace CLK2 is on the passivation layer 406, thus the first signal trace CLK1 and the second signal trace CLK2 are spaced apart from each other by the gate insulation layer 405 and the passivation layer 406 so that the first signal trace CLK1 and the second signal trace CLK2 are insulated from each other. Of course, the positions of the first signal trace CLK1 and the second signal trace CLK2 can be interchanged, no limitation is imposed to this in the present disclosure.

In some embodiments of the present disclosure, the circuit substrate 10 further includes a plurality of signal trace groups 300, and the two signal traces SL of each of the plurality of signal trace groups 300 are respectively in different layers and are insulated from each other; and orthographic projections of the two signal traces SL of each of the plurality of signal trace groups 300 on the base substrate 100 at least partially overlap with each other.

For example, in examples illustrated in FIG. 7-FIG. 11, the plurality of signal trace groups 300 include a first signal trace group and a second signal trace group. Two signal traces of the first signal trace group are respectively a first signal trace CLK1 and a second signal trace CLK2, and two signal traces of the second signal trace group are respectively a third signal trace CLK3 and a fourth signal trace CLK4. The first signal trace CLK1 and the second signal trace CLK2 provide clock signals with inverted phases, and the third signal trace CLK3 and the fourth signal trace CLK4 provide clock signals with inverted phases.

Figure 7:
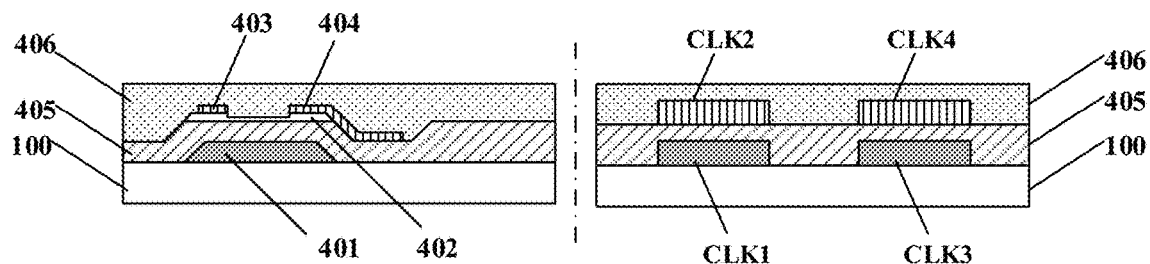
FIG. 7 is a schematic diagram of an arrangement mode of four signal traces of two signal trace groups.

For example, in an example illustrated in FIG. 7, both the two signal traces of the first signal trace group and the two signal traces of the second signal trace group are spaced apart from each other by the gate insulation layer 405, so that the two signal traces of the first signal trace group are insulated from each other and the two signal traces of the second signal trace group are insulated from each other. For example, the first signal trace CLK1, the third signal trace CLK3 and the gate metal layer 401 are in a same layer, and the second signal trace CLK2, the fourth signal trace CLK4 and the source/drain metal layer 403, 404 are in a same layer. Of course, the positions of the first signal trace CLK1 and the second signal trace CLK2 can be interchanged, and the positions of the third signal trace CLK3 and the fourth signal trace CLK4 can also be interchanged. No limitation is imposed to this in the present disclosure, and it is same in the following embodiments and is not be repeated.

Figure 8:
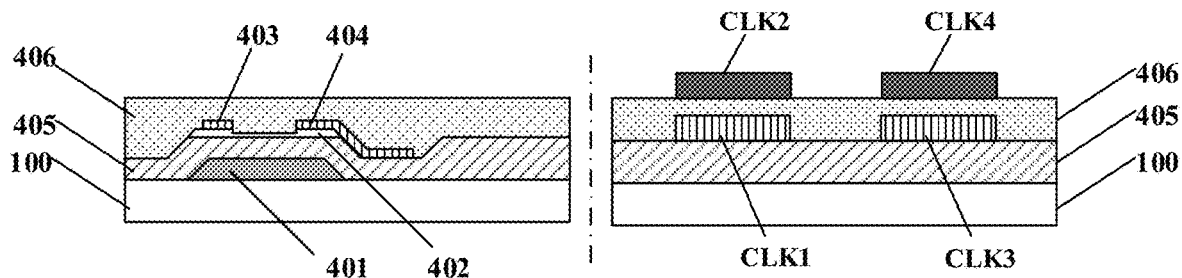
FIG. 8 is another schematic diagram of an arrangement mode of four signal traces of two signal trace groups.

For example, in an example illustrated in FIG. 8, both the two signal traces of the first signal trace group and the two signal traces of the second signal trace group are spaced apart from each other by the passivation layer 406, so that the two signal traces of the first signal trace group are insulated from each other and the two signal traces of the second signal trace group are insulated from each other. For example, the first signal trace CLK1, the third signal trace CLK3 and the source/drain metal layer 403, 404 are in a same layer, and the second signal trace CLK2, the fourth signal trace CLK4 are on the passivation layer 406, thus both the two signal traces of the first signal trace group and the two signal traces of the second signal trace group are spaced apart from each other by the passivation layer 406, so that the two signal traces of the first signal trace group are insulated from each other and the two signal traces of the second signal trace group are insulated from each other.

Figure 9:
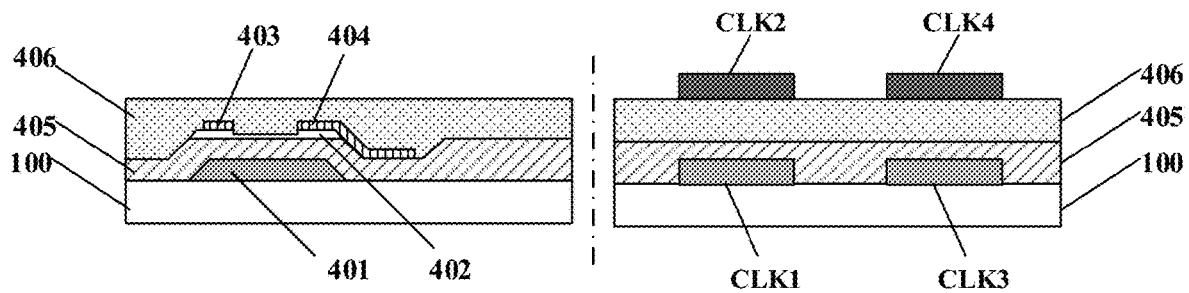
FIG. 9 is another schematic diagram of an arrangement mode of four signal traces of two signal trace groups.

For example, in an example illustrated in FIG. 9, both the two signal traces of the first signal trace group and the two signal traces of the second signal trace group are spaced apart from each other by the gate insulation layer 405 and the passivation layer 406, so that the two signal traces of the first signal trace group are insulated from each other and the two signal traces of the second signal trace group are insulated from each other. For example, the first signal trace CLK1, the third signal trace CLK3 and the gate metal layer 401 are in a same layer, and the second signal trace CLK2, the fourth signal trace CLK4 are on the passivation layer 406.

For example, in some embodiments of the present disclosure, one signal trace of the first signal trace group and one signal trace of the second signal trace group are in a same layer.

Figure 10:
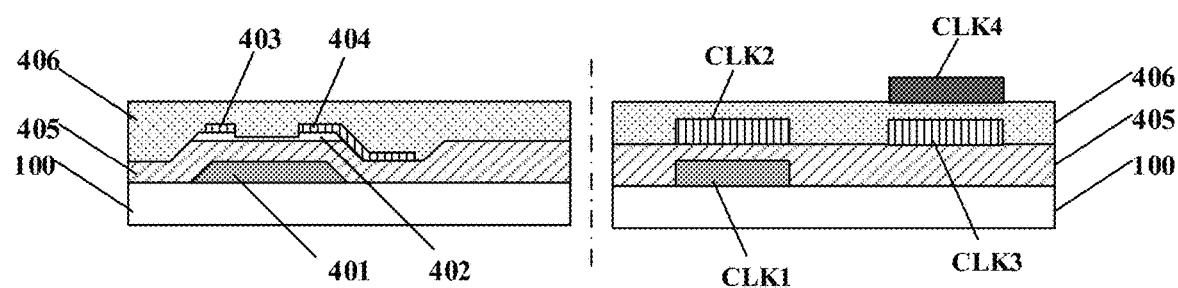
FIG. 10 is another schematic diagram of an arrangement mode of four signal traces of two signal trace groups.

For example, in an example illustrated in FIG. 10, the two signal traces of the first signal trace group are spaced apart from each other by the gate insulation layer 405 so that the two signal traces of the first signal trace group are insulated from each other, and the two signal traces of the second signal trace group are spaced apart from each other by the passivation layer 406 so that the two signal traces of the second signal trace group are insulated from each other. For example, the first signal trace CLK1 and the gate metal layer 401 are in a same layer, the second signal trace CLK2, the third signal trace CLK3 and the source/drain metal layer 403, 404 are in a same layer, and the fourth signal trace CLK4 is on the passivation layer 406. In the example illustrated in FIG. 10, the second signal trace CLK2 of the first signal trace group and the third signal trace CLK3 of the second signal trace group are in a same layer.

Figure 11:
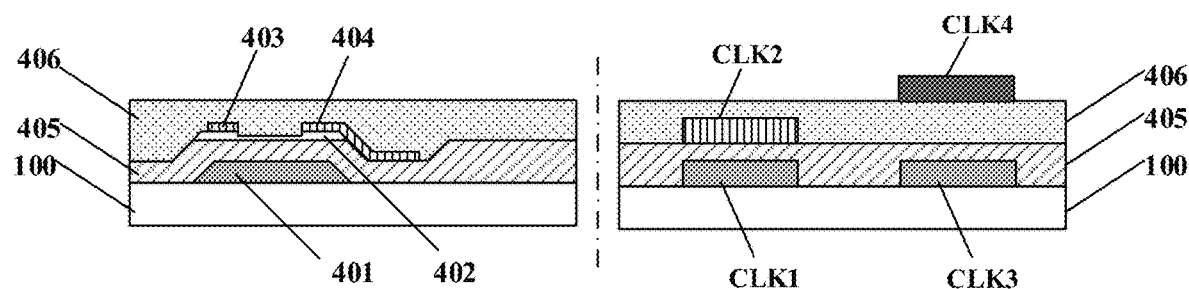
FIG. 11 is another schematic diagram of an arrangement mode of four signal traces of two signal trace groups.

For example, in an example illustrated in FIG. 11, the two signal traces of the first signal trace group are spaced apart from each other by the gate insulation layer 405 so that the two signal traces of the first signal trace group are insulated from each other, and the two signal traces of the second signal trace group are spaced apart from each other by the gate insulation layer 405 and the passivation layer 406 so that the two signal traces of the second signal trace group are insulated from each other. For example, the first signal trace CLK1, the third signal trace CLK3 and the gate metal layer 401 are in a same layer, the second signal trace CLK2 and the source/drain metal layer 403, 404 are in a same layer, and the fourth signal trace CLK4 is on the passivation layer 406. In the example illustrated in FIG. 10, the first signal trace CLK1 of the first signal trace group and the third signal trace CLK3 of the second signal trace group are in a same layer.

It should be noted that the term "in a same layer" in the present disclosure means that a plurality of structures are formed by a same patterning process on a same material layer, and it is not necessary for the plurality of structures to be in a same plane in physical space.

In at least one embodiment of the present disclosure, a case where one signal trace group is provided on the base substrate 100 and a case where two signal trace groups are provided on the base substrate 100 are described, based on the descriptions and instructions of the setting method of the present disclosure, it is easy for those skilled in the art to think of a setting method in a case where the circuit substrate includes three or more signal trace groups without making creative work, and these setting methods are also within the protection scope of the present disclosure.

Figure 12:
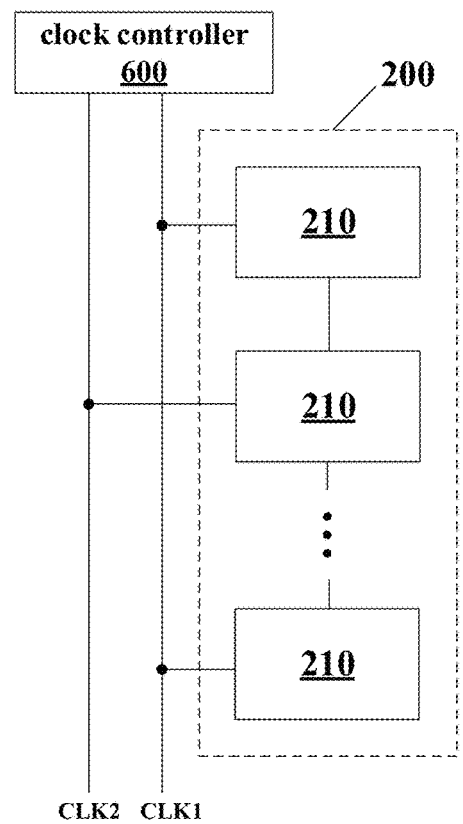
FIG. 12 is a schematic diagram of a connection mode of two signal traces of one signal trace group and a gate driving circuit.

In the circuit substrate 10 provided by at least one embodiment of the present disclosure, as illustrated in FIG. 12, in a case where the circuit substrate 10 includes one signal trace group, for example, the two signal traces of the signal trace group are respectively a first signal trace CLK1 and a second signal trace CLK2. The gate driving circuit 200 includes a plurality of cascaded shift register units 210, the first signal trace CLK1 is electrically connected with a (2n−1)th-stage of the shift register units 210, the second signal trace CLK2 is electrically connected with a (2n)th-stage of the shift register units 210, and n is an integer greater than or equal to 1. It should be noted that the present disclosure includes this cases but is not limited to this case, for example, the first signal trace CLK1 is electrically connected with the (2n)th-stage of the shift register units 210, and the second signal trace CLK2 is electrically connected with the (2n−1)th-stage of the shift register units 210.

Figure 13:
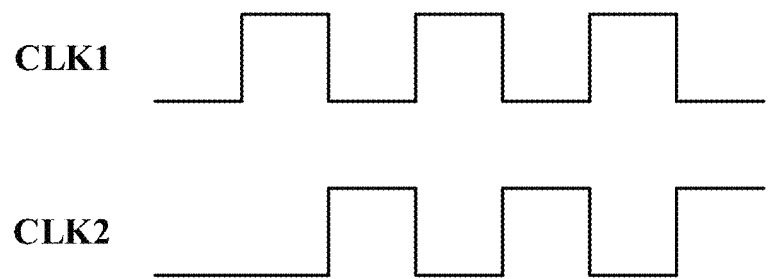
FIG. 13 is a timing diagram corresponding to clock signals provided by the signal traces in FIG. 12.

For example, the first signal trace CLK1 and the second signal trace CLK2 provide clock signals with inverted phases as illustrated in FIG. 13 for the gate driving circuit 200. For example, as illustrated in FIG. 12, the circuit substrate 10 provided by the embodiment of the present disclosure further includes a clock controller 600, the first signal trace CLK1 and the second signal trace CLK2 are connected with the clock controller 600, and the clock controller 600 is configured to provide clock signals with inverted phases to the first signal trace CLK1 and the second signal trace CLK2.

Figure 14:
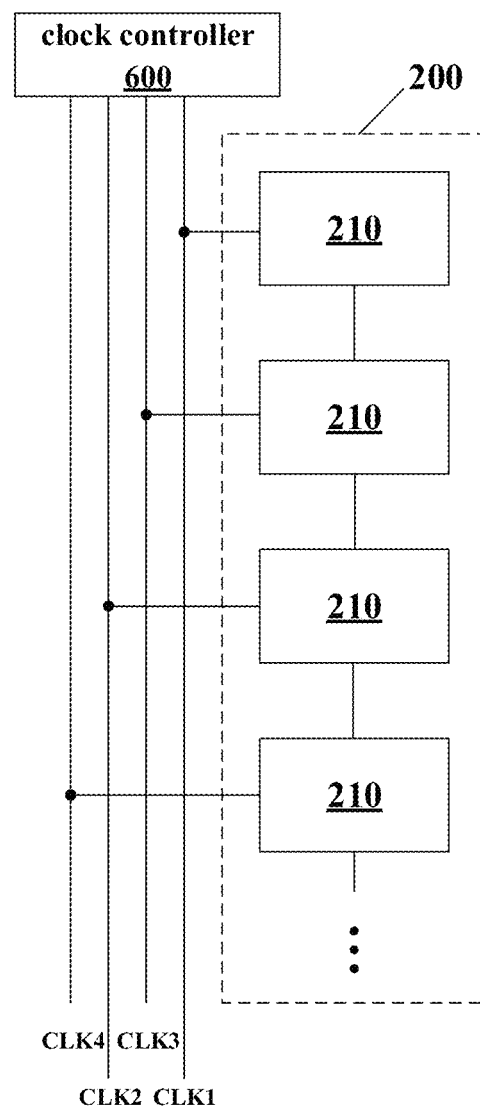
FIG. 14 is a schematic diagram of a connection mode of four signal traces of two signal trace group and a gate driving circuit.

In the circuit substrate 10 provided by at least one embodiment of the present disclosure, as illustrated in FIG. 14, in a case where the circuit substrate 10 includes two signal trace groups, for example, the two signal traces of the first signal trace group are respectively a first signal trace CLK1 and a second signal trace CLK2, and the two signal traces of the second signal trace group are respectively a third signal trace CLK3 and a fourth signal trace CLK4.

The gate driving circuit 200 includes a plurality of cascaded shift register units 210, the first signal trace CLK1 is electrically connected with a (4m−3)th-stage of the shift register units, the third signal trace CLK3 is electrically connected with a (4m−2)th-stage of the shift register units, the second signal trace CLK2 is electrically connected with a (4m−1)th-stage of the shift register units, the fourth signal trace CLK4 is electrically connected with a (4m)th-stage of the shift register units, and m is an integer greater than or equal to 1.

For example, as illustrated in FIG. 14, the circuit substrate 10 provided by at least one embodiment of the present disclosure further includes a clock controller 600, the first signal trace CLK1, the second signal trace CLK2, the third signal trace CLK3 and the fourth signal trace CLK4 are connected with the clock controller 600, and the clock controller 600 is configured to provide clock signals to the first signal trace CLK1, the second signal trace CLK2, the third signal trace CLK3 and the fourth signal trace CLK4.

Figure 15:
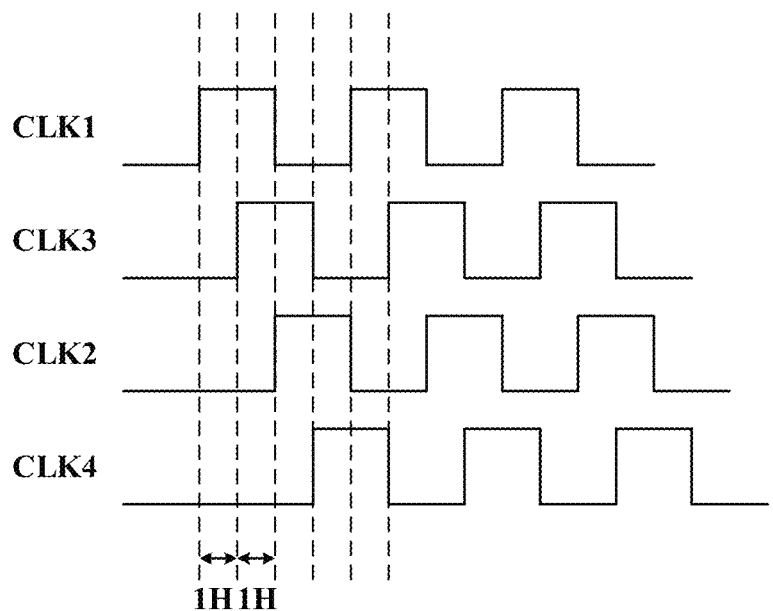
FIG. 15 is a timing diagram corresponding to clock signals provided by the signal traces in FIG. 14.

For example, FIG. 15 is a timing diagram corresponding to clock signals provided by the signal traces in FIG. 14. As illustrated in FIG. 15, each of the clock signals of CLK1. CLK2, CLK3 and CLK4 can adopt a timing signal of a duty ratio which is 50%. A duration of a high level of each of the clock signals is 2H (a system clock period is recorded as 1H). It corresponds to an opening time, which is 2H, of each gate line GL in the gate driving circuit 200. For example, pre-charging is performed in the first 1H time of the 2H, and actual charging is performed in the second 1H time of the 2H. In the case illustrated in FIG. 14, the plurality of cascaded shift register units 210 are arranged line by line, thus the clock signals of CLK1, CLK3, CLK2 and CLK4 which are respectively connected with the shift register units 210 of all stages are successively different by one system clock period which is 1H.

Figure 16:
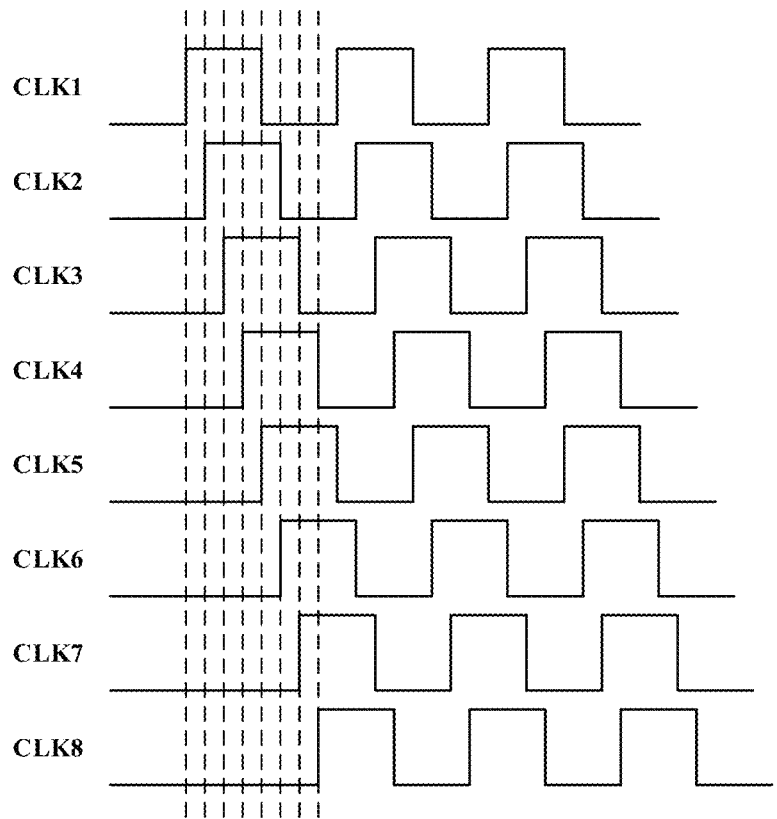
FIG. 16 is a timing diagram of clock signals used for a gate driving circuit.

FIG. 16 is a timing diagram of clock signals used for a gate driving circuit, and for example, the clock signals of FIG. 16 can be used for the gate driving circuit 200 in the circuit substrate 10 provided by at least one embodiment of the present disclosure. For example, as illustrated in FIG. 16, eight signal traces (a first signal traces CLK1—an eighth signal traces CLK8) are used to provide clock signals for the gate drive circuit 200. The eight signal traces are successively electrically connected with the plurality of cascaded shift register units 210 of the gate driving circuit 200. For example, in the example illustrated in FIG. 16, a period of the clock signal provided by each of the signal traces is 1T, thus a time sequence difference between the two signal traces respectively connected with adjacent stages of the shift register units is ⅛T.

In the example illustrated in FIG. 16, phases of the clock signals of the first signal trace CLK1 and the fifth signal trace CLK5 are inverted to each other, phases of the clock signals of the second signal trace CLK2 and the fifth sixth trace CLK6 are inverted to each other, phases of the clock signals of the third signal trace CLK3 and the seventh signal trace CLK7 are inverted to each other, and phases of the clock signals of the fourth signal trace CLK4 and the eighth signal trace CLK8 are inverted to each other. Therefore, the eight signal traces mentioned above constitute four signal trace groups 300, and in a case where the four signal trace groups 300 are provided on the base substrate 100, the two signal traces of each of the four signal trace groups 300 are respectively in different layers and are insulated with each other, and orthographic projections of the two signal traces of each of the four signal trace groups 300 on the base substrate 100 at least partially overlap with each other.

It should be noted that the embodiments of the present disclosure are not limited to the signal timing illustrated in FIG. 15 and FIG. 16, and clock signals can also adopt timing signals of other duty ratios and periods.

Figure 17:
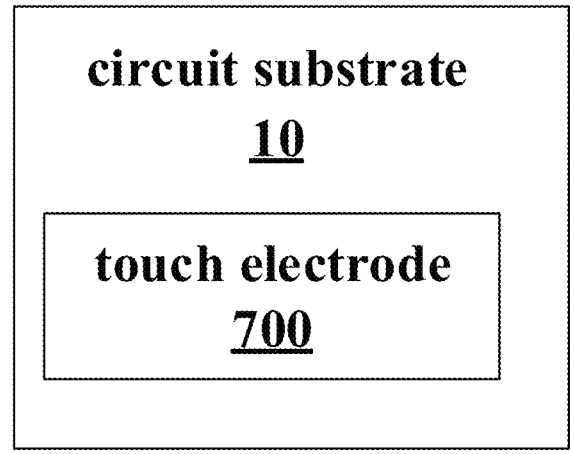
FIG. 17 is a schematic diagram of another circuit substrate provided by an embodiment of the present disclosure.

In the circuit substrate 10 provided by at least one embodiment of the present disclosure, as illustrated in FIG. 17, the circuit substrate 10 further includes a touch electrode 700 to achieve a control function. For example, the circuit substrate 10 includes a plurality of touch electrodes 700, and the plurality of touch electrodes 700 are on the base substrate 100 and arranged in an array. For example, in a case where a mutual capacitance touch mode is adopted, the touch electrodes 700 include a driving electrode and a sensing electrode.

For example, in a case where the circuit substrate 10 provided by at least one embodiment of the present disclosure includes the touch electrode 700, each of the at least one trace group 300 includes two signal traces SL. The two signal traces SL are respectively in different layers and orthographic projections of the two signal traces on the base substrate 100 at least partially overlap with each other. Because the clock signals transmitted by the two signal traces SL are inverted to each other, interferences caused by noises of the clock signals on the two signal traces SL are offset by each other, interferences caused by the clock signals on the touch electrode 700 are reduced, so that the touch performance of the touch product adopting the circuit substrate 10 is improved.

At least one embodiment of the present disclosure further provides a display panel, and the display panel includes any circuit substrate 10 provided by at least one embodiment of the present disclosure. For example, in a case where the display panel includes an array substrate and an opposite substrate, the circuit substrate 10 serves as the array substrate in the display panel, and for example, in this case, the circuit substrate 10 further includes pixel units arranged in an array, etc.

It should be noted that no limitation is imposed to a type of the display panel, and the display panel can be of various types such as a liquid crystal display panel, an OLED (Organic Light Emitting Diode) display panel, etc., as long as the display panel includes the circuit substrate 10 provided by at least one embodiment of the present disclosure. In addition, for example, the display panel further includes gate lines, data lines, switch circuits and other general designs, no repetition herein.

Figure 18:
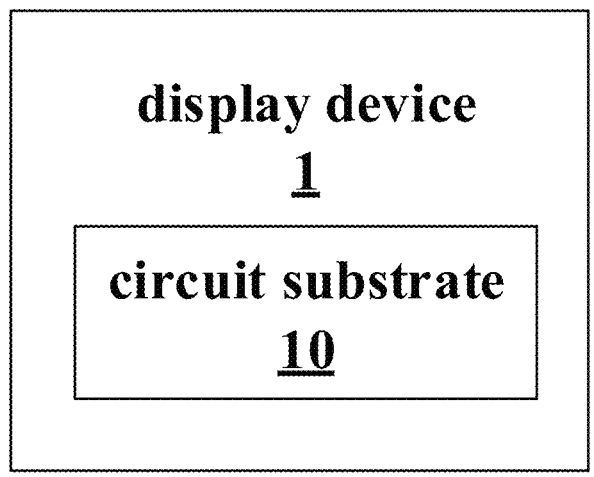
FIG. 18 is a schematic diagram of a display device provided by an embodiment of the present disclosure.

At least one embodiment of the present disclosure further provides a display device 1, as illustrated in FIG. 18. The display device 1 includes any circuit substrate 10 provided by at least one embodiment of the present disclosure. For example, the display device 1 includes the display panel provided by the above embodiments, and the circuit substrate 10 serves as the array substrate in the display panel.

The display device 1 provided by at least one embodiment of the present disclosure includes any products or components having display function as follows: liquid crystal display panel, liquid crystal television, displayer, OLED panel, OLED television, e-Paper, mobile phone, panel computer, laptop, digital photo frame, navigation instrument or the like. No limitation is imposed on the type of the display device 1.

Figure 19:
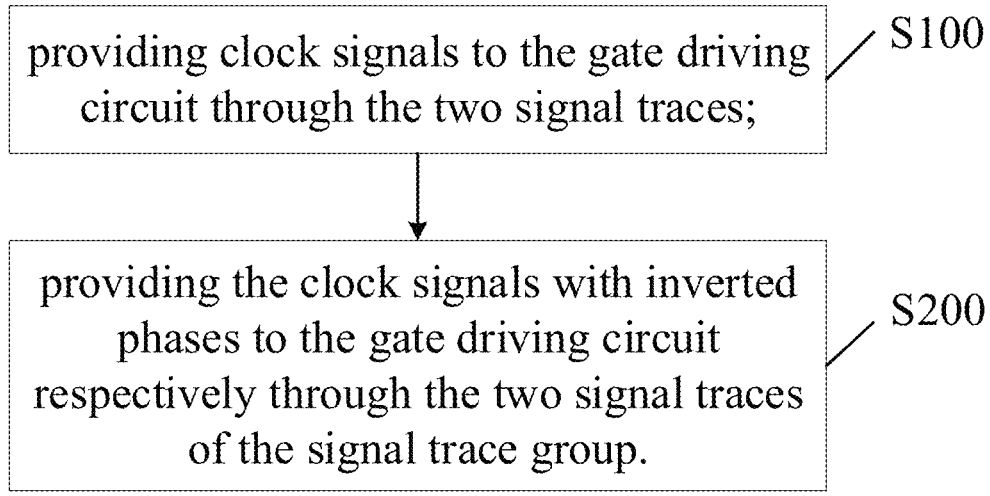
FIG. 19 is a schematic diagram of a driving method provided by an embodiment of the present disclosure.

At least one embodiment of the present disclosure further provides a driving method, and the driving method can be used for the circuit substrate 10 provided by at least one embodiment of the present disclosure. For example, as illustrated in FIG. 19, the driving method includes the following operations.

Step S100: providing clock signals to the gate driving circuit through the two signal traces.

Step S200: providing the clock signals with inverted phases to the gate driving circuit respectively through the two signal traces of the signal trace group 300.

Because orthographic projections of the two signal traces of the signal trace group 300 in the circuit substrate 10 at least partially overlap with each other, when the two signal traces of the signal trace group 300 provided clock signals with inverted phases, interferences caused by noises of the clock signals on the two signal traces are partially offset by each other, which reduces interferences caused by the clock signals on a touch product adopting the circuit substrate 10, so that the touch performance of the touch product is improved.

For example, in another embodiment, the two signal traces of the first signal trace group 300 are respectively a first signal trace CLK1 and a second signal trace CLK2, and the gate driving circuit 200 includes a plurality of cascaded shift register units 210, in this case, the above-mentioned driving method further includes the following operation.

Step S300: providing a clock signal to a (2n−1)th-stage of the shift register units through the first signal trace CLK1, and providing another clock signal to a (2n)th-stage of the shift register units through the second signal trace CLK2, in which n is an integer greater than or equal to 1.

For example, in the step S300, the phases of the clock signals provided by the first signal trace CLK1 and the second signal trace CLK2 are inverted.

For example, in another embodiment, the at least one signal trace group 300 includes a first signal trace group and a second signal trace group; two signal traces of the first signal trace group are respectively a first signal trace CLK1 and a second signal trace CLK2, two signal traces of the second signal trace group are respectively a third signal trace CLK3 and a fourth signal trace CLK4, and the gate driving circuit 200 includes a plurality of cascaded shift register units 210. In this case, the above-mentioned driving method further includes the following operation.

Step S400: providing a clock signal to a (4m−3)th-stage of the shift register units through the first signal trace CLK1, providing another clock signal to a (4m−2)-stage of the shift register units through the third signal trace CLK3, providing further another clock signal to a (4m−1)th-stage of the shift register units through the second signal trace CLK2, and providing further another clock signal to a (4m)th-stage of the shift register units through the fourth signal trace CLK4, in which m is an integer greater than or equal to 1.

For example, in the step S400, the phases of the clock signals provided by the first signal trace CLK1 and the second signal trace CLK2 are inverted, and the phases of the clock signals provided by the first signal trace CLK3 and the second signal trace CLK4 are inverted.

What have been described above are only specific implementations of the present disclosure, the protection scope of the present disclosure is not limited thereto. The protection scope of the present disclosure should be based on the protection scope of the claims.

What is claimed is:

1. A circuit substrate, comprising a base substrate, a gate driving circuit on the base substrate, and a plurality of signal trace groups on the base substrate,
wherein each of the plurality of signal trace groups comprises two signal traces; the two signal traces of each of the plurality of signal trace groups are electrically connected with the gate driving circuit and are configured to provide clock signals with inverted phases to the gate driving circuit; the two signal traces of each of the plurality of signal trace groups are respectively in different layers and are insulated from each other; and orthographic projections of the two signal traces of each of the plurality of signal trace groups on the base substrate at least partially overlap with each other;
wherein the plurality of signal trace groups comprises a first signal trace group and a second signal trace group; at least one of two signal traces of the first signal trace group is on a different layer than two signal traces of the second signal trace group.

2. The circuit substrate according to claim 1, further comprising a gate insulation layer for a thin film transistor and a passivation layer covering the thin film transistor,
the two signal traces of the first signal trace group are spaced apart from each other by the gate insulation layer so that the two signal traces of the first signal trace group are insulated from each other, and the two signal traces of the second signal trace group are spaced apart from each other by the gate insulation layer so that the two signal traces of the second signal trace group are insulated from each other; or
the two signal traces of the first signal trace group are spaced apart from each other by the passivation layer so that the two signal traces of the first signal trace group are insulated from each other, and the two signal traces of the second signal trace group are spaced apart from each other by the passivation layer so that the two signal traces of the second signal trace group are insulated from each other.

3. The circuit substrate according to claim 2,
wherein the two signal traces of the first signal trace group are respectively a first signal trace and a second signal trace, and the two signal traces of the second signal trace group are respectively a third signal trace and a fourth signal trace;
the gate driving circuit comprises a plurality of cascaded shift register units, the first signal trace is electrically connected with a (4m−3)th-stage of the shift register units, the third signal trace is electrically connected with a (4m−2)th-stage of the shift register units, the second signal trace is electrically connected with a (4m−1)th-stage of the shift register units, and the fourth signal trace is electrically connected with a (4m)th-stage of the shift register units, wherein m is an integer greater than or equal to 1.

4. The circuit substrate according to claim 1, further comprising a gate insulation layer for a thin film transistor and a passivation layer covering the thin film transistor,
wherein the plurality of signal trace groups comprises a first signal trace group and a second signal trace group;
two signal traces of the first signal trace group are spaced apart from each other by the gate insulation layer so that the two signal traces of the first signal trace group are insulated from each other, and two signal traces of the second signal trace group are spaced apart from each other by the passivation layer so that the two signal traces of the second signal trace group are insulated from each other.

5. The circuit substrate according to claim 4, wherein the gate insulation layer and the passivation layer are between the two signal traces of the second signal trace group.

6. The circuit substrate according to claim 4, wherein one signal trace of the first signal trace group and one signal trace of the second signal trace group are in a same layer.

7. The circuit substrate according to claim 4,
wherein the two signal traces of the first signal trace group are respectively a first signal trace and a second signal trace, and the two signal traces of the second signal trace group are respectively a third signal trace and a fourth signal trace;
the gate driving circuit comprises a plurality of cascaded shift register units, the first signal trace is electrically connected with a (4m−3)th-stage of the shift register units, the third signal trace is electrically connected with a (4m−2)th-stage of the shift register units, the second signal trace is electrically connected with a (4m−1)th-stage of the shift register units, and the fourth signal trace is electrically connected with a (4m)th-stage of the shift register units, wherein m is an integer greater than or equal to 1.

8. The circuit substrate according to claim 1, further comprising a plurality of touch electrodes,
wherein the plurality of touch electrodes is on the base substrate and arranged in an array.

9. A driving method for the circuit substrate according to claim 1, comprising:
providing clock signals to the gate driving circuit through the two signal traces; and
providing the clock signals with inverted phases to the gate driving circuit respectively through the two signal traces of each of the plurality of signal trace groups.

10. The driving method according to claim 9,
wherein the plurality of signal trace groups comprises a first signal trace group and a second signal trace group; two signal traces of the first signal trace group are respectively a first signal trace and a second signal trace, two signal traces of the second signal trace group are respectively a third signal trace and a fourth signal trace, and the gate driving circuit comprises a plurality of cascaded shift register units;
the driving method further comprises:
providing a clock signal to a (4m−3)th-stage of the shift register units through the first signal trace,
providing another clock signal to a (4m−2)th-stage of the shift register units through the third signal trace,
providing further another clock signal to a (4m−1)th-stage of the shift register units through the second signal trace, and
providing further another clock signal to a (4m)th-stage of the shift register units through the fourth signal trace, wherein m is an integer greater than or equal to 1.

11. A display device, comprising a circuit substrate,
wherein the circuit substrate comprises a base substrate, a gate driving circuit on the base substrate, and a plurality of signal trace groups on the base substrate,
each of the plurality of signal trace groups comprises two signal traces; the two signal traces of each of the plurality of signal trace groups are electrically connected with the gate driving circuit and are configured to provide clock signals with inverted phases to the gate driving circuit; the two signal traces of each of the plurality of signal trace groups are respectively in different layers and are insulated from each other; and orthographic projections of the two signal traces of each of the plurality of signal trace groups on the base substrate at least partially overlap with each other;

wherein at least one of two signal traces of one of the plurality of signal trace groups is on a different layer than two signal traces of another of the plurality of signal trace groups.

12. The display device according to claim 11, wherein the circuit substrate comprises a plurality of touch electrodes, and the plurality of touch electrodes are on the base substrate and arranged in an array.

* * * * *